US008359553B1

(12) United States Patent
Aleksanyan et al.

(10) Patent No.: US 8,359,553 B1
(45) Date of Patent: Jan. 22, 2013

(54) VARIOUS METHODS AND APPARATUSES FOR EFFECTIVE YIELD ENHANCEMENT OF GOOD CHIP DIES HAVING MEMORIES PER WAFER

(75) Inventors: Karen Aleksanyan, Yerevan (AM);
Valery Vardanian, Yerevan (AM);
Yervant Zorian, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 93 days.

(21) Appl. No.: 12/985,930

(22) Filed: Jan. 6, 2011

Related U.S. Application Data

(63) Continuation of application No. 12/194,454, filed on Aug. 19, 2008, now Pat. No. 7,890,900.

(51) Int. Cl.
*G06F 17/50* (2006.01)
(52) U.S. Cl. ............................. 716/52; 716/54; 716/112
(58) Field of Classification Search .................. 716/52, 716/54, 112
See application file for complete search history.

(56) References Cited

U.S. PATENT DOCUMENTS

| | | | | |
|---|---|---|---|---|
| 4,335,459 A * | 6/1982 | Miller | ............................. | 714/755 |
| 5,539,652 A * | 7/1996 | Tegethoff | ......................... | 703/14 |
| 6,324,436 B1 * | 11/2001 | Moresco | ......................... | 700/36 |
| 6,363,020 B1 * | 3/2002 | Shubat et al. | .................. | 365/200 |
| 6,519,202 B1 | 2/2003 | Shubat et al. | | |
| 6,701,477 B1 * | 3/2004 | Segal | ........................... | 714/732 |
| 6,745,370 B1 * | 6/2004 | Segal et al. | ....................... | 716/50 |
| 6,870,780 B2 * | 3/2005 | Park et al. | ...................... | 365/200 |
| 6,885,950 B2 * | 4/2005 | Mitsutake et al. | ............... | 702/58 |
| 6,920,596 B2 * | 7/2005 | Sagatelian et al. | ............. | 714/732 |
| 7,194,366 B2 * | 3/2007 | Singh et al. | ...................... | 702/81 |
| 7,406,620 B2 * | 7/2008 | Shubat et al. | ................... | 714/6.1 |

OTHER PUBLICATIONS

Segal et al.; "Determining Redundancy Requirements for Memory Arrays with Critical Area Analysis"; Memory Technology, Design and Testing, IEEE; Publication Year: 1999; pp. 48-53.*
Zorian, Y., "Embedded Memory Test & Repair / Infrastructure IP for SOC Yield," ITC International Test Conference, IEEE, 2002, pp. 340-349.

* cited by examiner

*Primary Examiner* — Naum Levin
(74) *Attorney, Agent, or Firm* — Fenwick & West LLP

(57) ABSTRACT

A method and apparatus are described in which an optimal configuration of memory instances is determined. The optimal configuration of memory instances to be fabricated with built-in repair capacity and memory instances that are non-repairable may provide a maximum number of good chip dies per wafer. An amount of memory instances to be fabricated with built-in repair capacity as well as a remaining amount of memory instances to be fabricated without any built-in repair components in the integrated circuit design is determined relative to achieving the maximum number of good chip dies per wafer for a given defect density and wafer area. The amount of good dies produced per fabricated wafer for a populated amount of memories with built-in repair components is determined to be between an amount established by a minimum limit for the die area up to the amount established by a maximum limit for the die area.

15 Claims, 6 Drawing Sheets

| Defect density | All non-repairable | | All repairable | | Industry standard | | Tool's Algorithm | |
|---|---|---|---|---|---|---|---|---|
| | GDW | Yield | GDW | Yield | GDW | Yield | GDW | Yield |
| 0.12 /cm^2 | 293.628 | 0.965 | 287.902 | 0.971 | 311.732 | 0.970 | 317.458 | 0.972 |
| 0.22 /cm^2 | 285.276 | 0.938 | 281.213 | 0.949 | 304.149 | 0.946 | 308.471 | 0.947 |
| 0.32 /cm^2 | 277.258 | 0.911 | 274.774 | 0.927 | 296.934 | 0.925 | 301.142 | 0.927 |
| 0.42 /cm^2 | 269.556 | 0.886 | 268.572 | 0.906 | 290.066 | 0.904 | 294.103 | 0.905 |
| 0.72 /cm^2 | 248.176 | 0.816 | 251.263 | 0.848 | 271.288 | 0.848 | 273.685 | 0.848 |
| 0.82 /cm^2 | 241.576 | 0.794 | 245.89 | 0.829 | 265.503 | 0.830 | 267.156 | 0.830 |
| 0.92 /cm^2 | 235.218 | 0.773 | 240.698 | 0.812 | 259.921 | 0.813 | 261.274 | 0.813 |

550 ⟶

Figure 5

VARIOUS METHODS AND APPARATUSES FOR EFFECTIVE YIELD ENHANCEMENT OF GOOD CHIP DIES HAVING MEMORIES PER WAFER

CROSS REFERENCE TO RELATED APPLICATIONS

This patent application is a continuation, and claims priority to, U.S. patent application Ser. No. 12/194,454, filed on Aug. 19, 2008, (issued as U.S. Pat. No. 7,890,900 on Feb. 15, 2011) and titled "Various Methods and Apparatuses for Effective Yield Enhancement of Good Chip Dies Having Memories per Wafer," which is incorporated by reference herein in its entirety.

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office patent file or records, but otherwise reserves all copyright rights whatsoever.

FIELD

Aspects of embodiments of the invention relate to the field of designing integrated circuits; and more specifically, to the designing and fabricating integrated circuits with embedded memory systems having built-in repair capability.

BACKGROUND

Advances in today's System-on-Chip (SoC) technology allow embedding of hundreds of Static Random Access Memories (SRAM) on a single chip occupying more than half of the die area. A previous method of modeling defects is based on special kernels of design constructs that brings to many limitations. Also, other methods restrict themselves considering only the Poisson distribution of defects and that is also a serious restriction.

However, many problems connected with yield calculation of today's SoCs with hundreds of memory cores with different configuration remains open. The user needs urgently to understand before the design what configuration of the given memory type and size to choose, what type of memory (with or without redundant elements) to use, what amount and type of redundant elements (redundant rows only, redundant columns only, or both) to use to achieve the highest possible yield. The yield optimization problem is too difficult, especially for a memory system with a test and repair infrastructure. If repairable memories with redundant elements (rows and/or columns) are used in a memory system of a System on a Chip design then special built-in logic blocks are also embedded into the System on a Chip to test, allocate the redundant elements and repair the memories. The area of additional embedded blocks depends on each memory instance configuration, thus affecting the overall yield of both good functional chip dies fabricated and an amount of chip dies produced per silicon wafer.

SUMMARY OF THE INVENTION

A method and apparatus are described in which an optimal configuration of memory instances is determined. The optimal configuration of memory instances to be fabricated with built-in repair capacity and memory instances that are non-repairable may provide a maximum number of good chip dies per wafer. An amount of memory instances to be fabricated with built-in repair capacity as well as a remaining amount of memory instances to be fabricated without any built-in repair components in the integrated circuit design is determined relative to achieving the maximum number of good chip dies per wafer for a given defect density and wafer area. The amount of good dies produced per fabricated wafer for a populated amount of memories with built-in repair components is determined to be between an amount established by a minimum limit for the die area up to the amount established by a maximum limit for the die area.

BRIEF DESCRIPTION OF THE DRAWINGS

The drawings refer to embodiments of the invention in which:

FIG. 5 illustrates an example table having comparison data for a System on a Chip design with one hundred and nineteen memory instances.

Figure 1:
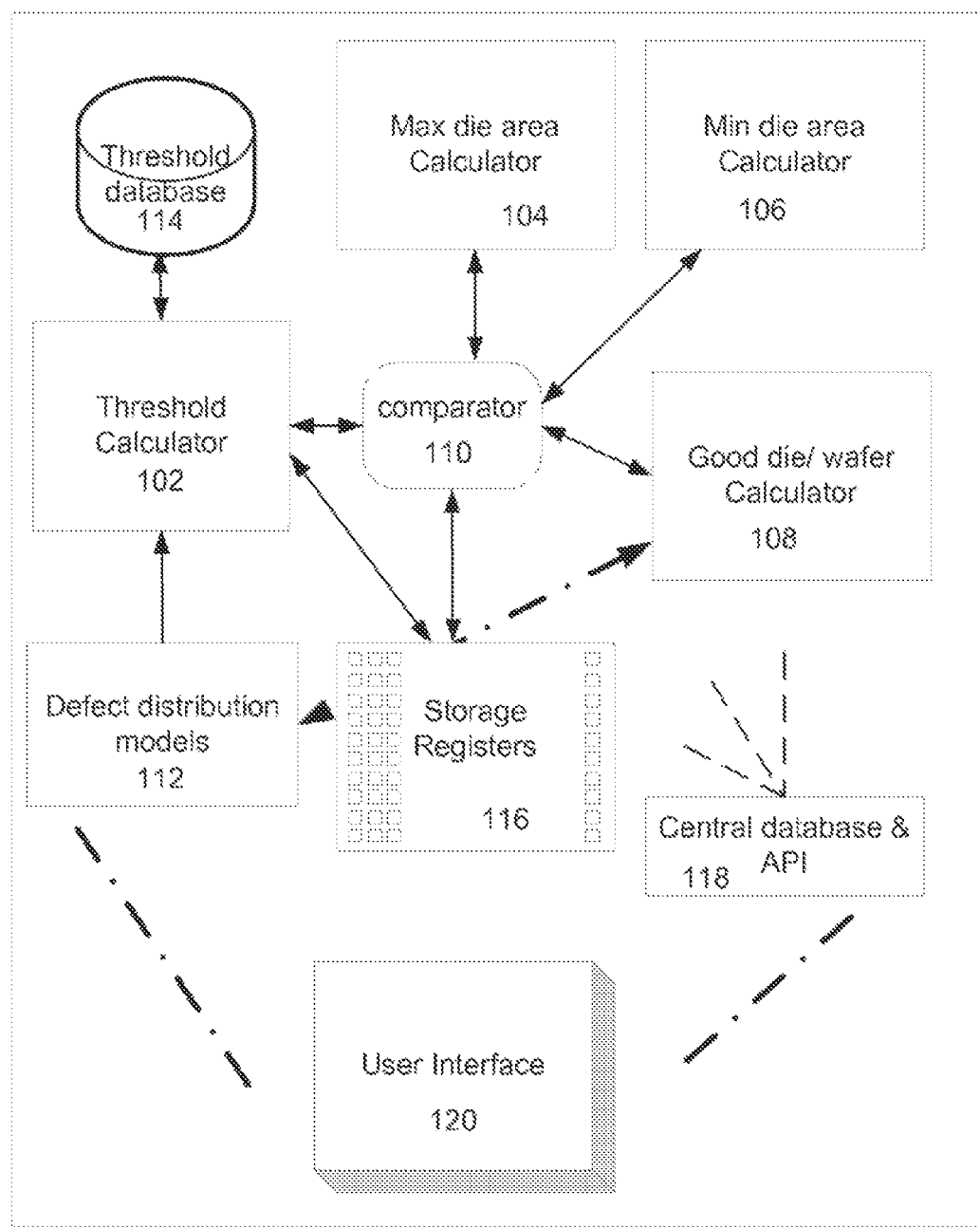
FIG. 1 illustrates an embodiment of an electronic design tool programmed to find an optimal configuration of memory instances to be fabricated with built-in repair components and memory instances that are non-repairable that provides a highest number of good chip dies per wafer.

While the invention is subject to various modifications and alternative forms, specific embodiments thereof have been shown by way of example in the drawings and will herein be described in detail. The embodiments of the invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific formulas, types of memories, named components, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references, such as first calculation, may be made. However, the specific numeric reference should not be interpreted as a literal sequential order but rather interpreted that the first calculation is different than a second calculation. Thus, the specific details set forth are merely exemplary. The specific details may be varied from and still be contemplated to be within the spirit and scope of the present invention.

In general, an electronic design tool is described that determines an optimal configuration of memory instances to provide a highest number of good chip dies per wafer. The electronic design tool may be configured with logic, software, and a combination of software and logic. The electronic design tool may be programmed to perform an algorithm to find the optimal configuration of memory instances to be fabricated with built-in repair components and memory instances that are non-repairable that provides the highest number of good chip dies per wafer. The algorithm is linear with respect to a number of memory instances used in a given integrated circuit design. The algorithm may implement steps to determine an amount of memories to be fabricated with built-in repair components to be between an amount established by a minimum limit for the die area up to the amount established by a maximum limit for the die area occupied by that chip. The electronic design tool determines the amount of memory instances to be fabricated with built-in repair components as well as a remaining amount of memory instances to be fabricated without any built-in repair components in the integrated circuit design in order to achieve the highest number of good chip dies per silicon wafer for a given defect density and die area.

FIG. 1 illustrates an embodiment of an electronic design tool programmed to find an optimal configuration of memory instances to be fabricated with built-in repair components and memory instances that are non-repairable that provides a highest number of good chip dies per wafer. The electronic design tool 100, in an embodiment named GOYA (General and Optimal Yield Analyzer) is configured with logic, software, or a combination of software and logic, and is programmed to perform an algorithm to find an optimal configuration of memory instances to be fabricated as repairable and non-repairable that provides a highest number of good chip dies per wafer. The electronic design GOYA tool 100 may have software routines, blocks of logic, and combinations of both to perform calculator functions, store and provide models, etc. In an embodiment, the electronic design GOYA tool 100 may have a threshold calculator 102, a maximum die area calculator 104, a minimum die area calculator 106, a good die per wafer calculator 108, a comparator 110, a library of defect distribution models 112, a database of threshold-values for each different memory instance 114, a set of storage registers 116, a central database of information and an application programming interface 118, a user interface 120, and similar other functional blocks. Thus, the GOYA tool 100 has one or more databases and libraries it can reference. The GOYA tool 100 can reference both memory design details and failure history information from the central database 118, the library of defect distribution models 112 and input from a designer thru the user interface 120. The GOYA tool 100 can reference the defect distribution models 112 connected with the manufacturing process technology to assist in creating the threshold-values for each different memory instance. Accordingly, the GOYA tool 100 can reference for, example, nanometer spacing for components, the area of the memories on the chip, have one or more defect distribution models, area of the wafer, the area of the chip, typical defect density values (defects/cm^2) for the chip having one or more memories in that particular fabrication process, and other similar parameters.

To model the yield of a given chip, some analytical probability model is necessary to describe the expected spatial distribution of manufacturing defects, and consequently, the resulting faults that cause yield loss. Good chip dies are produced when no defects exits on the fabricated die or the defects present on the fabricated die can be detected during quality control checks and then overcome through the use of built-in repair components fabricated into the integrated circuit design embedded on the chip die. An example yield model is the Poisson model. The GOYA tool 100 can reference the Poisson model of distribution of defects in fabricated memories on a chip.

The GOYA tool 100 uses the calculators 102, 104, 106, 108 and other blocks 110-118 to find the optimal configuration of memory instances to be as repairable or non-repairable that provides the highest number of good chip dies per wafer. Accordingly, the GOYA tool 100 may identify each possible combination or a subset of combinations of the amount of memory instances to make repairable and the amount of memory instances to leave non-repairable in a given integrated circuit design, such as a System on a Chip design, and the resulting number of good chip dies produced per silicon wafer. The GOYA tool 100 then determines an amount of memory instances to instantiate with built-in repair components as well as a remaining amount of memory instances to instantiate without any built-in repair components in the integrated circuit design to achieve the highest number of good chip dies per silicon wafer for a given defect density and die core area. Thru the user interface 120, a user may define the overall memory system size and the number of memory cores on the SoC, and the GOYA tool 100 will suggest the best configuration for each memory core with the highest possible overall SoC yield of good chip dies.

Figure 2:
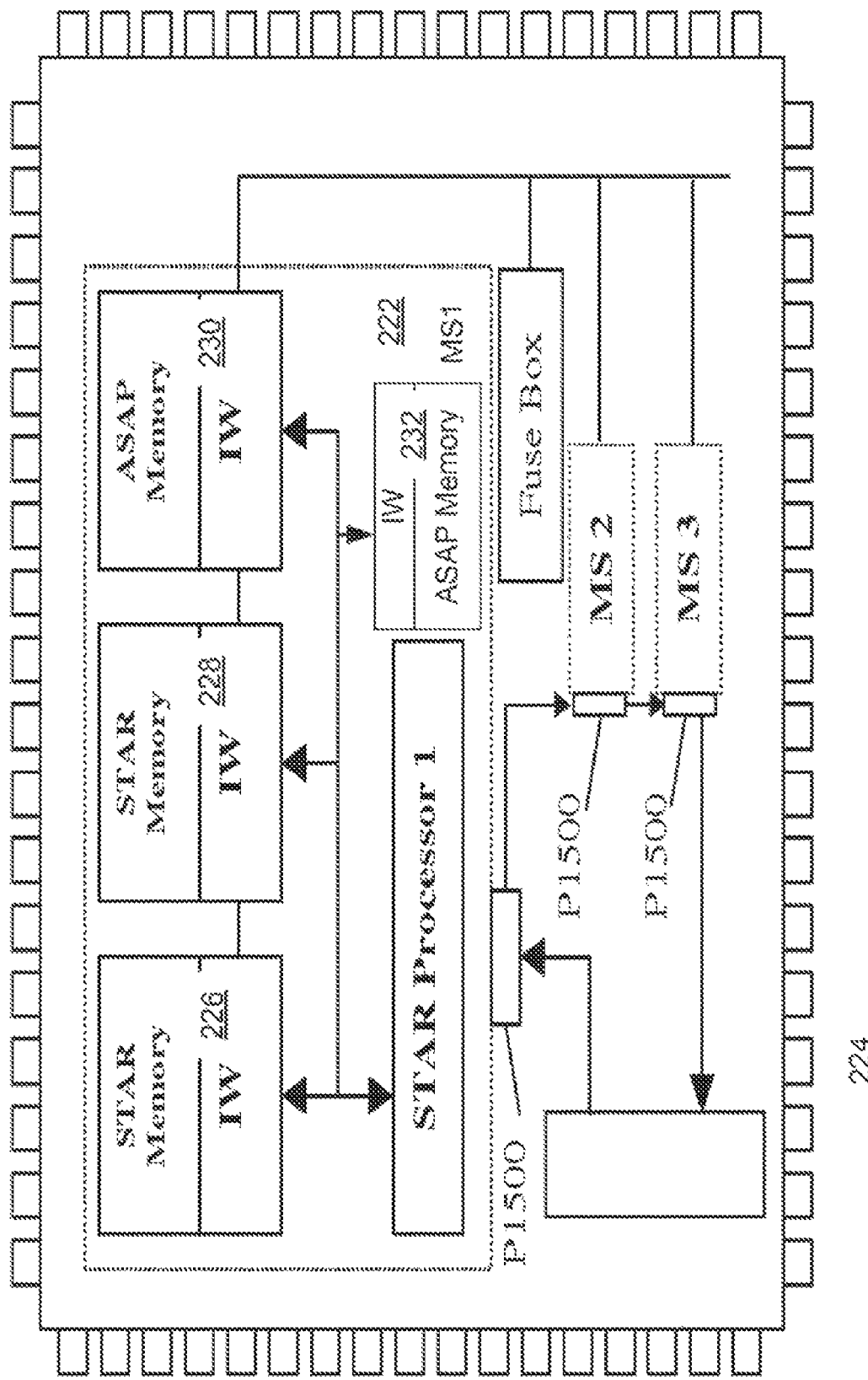
FIG. 2 illustrates an embodiment of a single integrated circuit fabricated on a chip die produced from the electronic design tool, which determined the amount of memory instances to be fabricated with built-in repair components as well as the remaining amount of memory instances to be fabricated without any built-in repair components in the integrated circuit design in order to achieve the highest number of good chip dies for that silicon wafer.

FIG. 2 illustrates an embodiment of a single integrated circuit fabricated on a chip die produced from the electronic design tool, which determined the amount of memory instances to be fabricated with built-in repair components as well as the remaining amount of memory instances to be fabricated without any built-in repair components in the integrated circuit design in order to achieve the highest number of good chip dies for that silicon wafer. The memory system 222, MS1-MS3, is merely shown on this integrated circuit 224. The example memory system 222 includes a number of hardware components: a Self-Test And Repair (STAR) Processor, a Fuse Box, Intelligent Wrappers (IW), as well as several memory cores with built-in redundant components to repair defect (STAR memories) 226, 228 and memory cores without built-in redundancies (low Area, high Speed and low Power (ASAP) memories) 230, 232.

Figure 3:
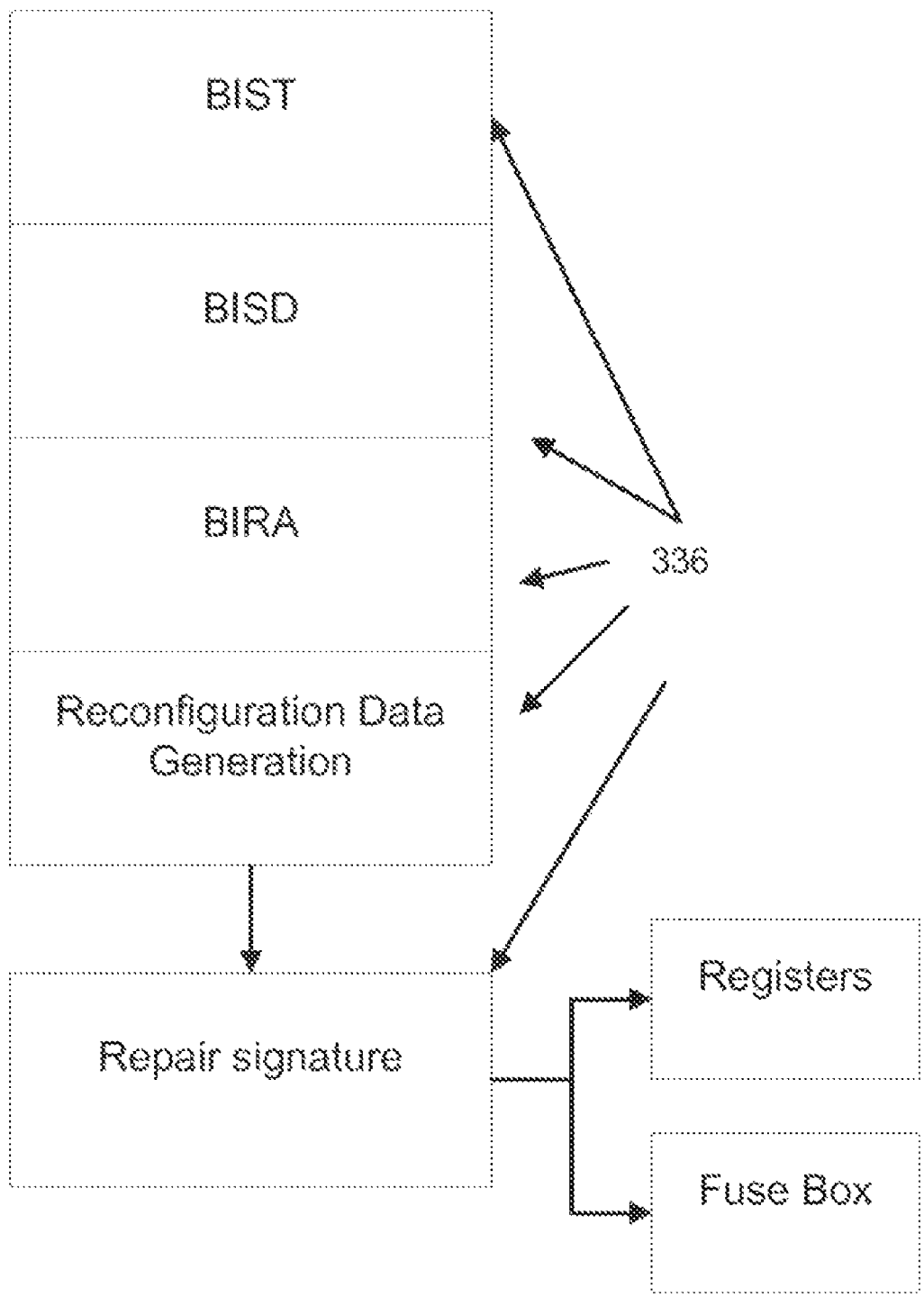
FIG. 3 illustrates an embodiment of logic block components making up an embodiment of a Self Test and Repair processor to test and repair memory instances potentially fabricated with defects.
Figure 4:
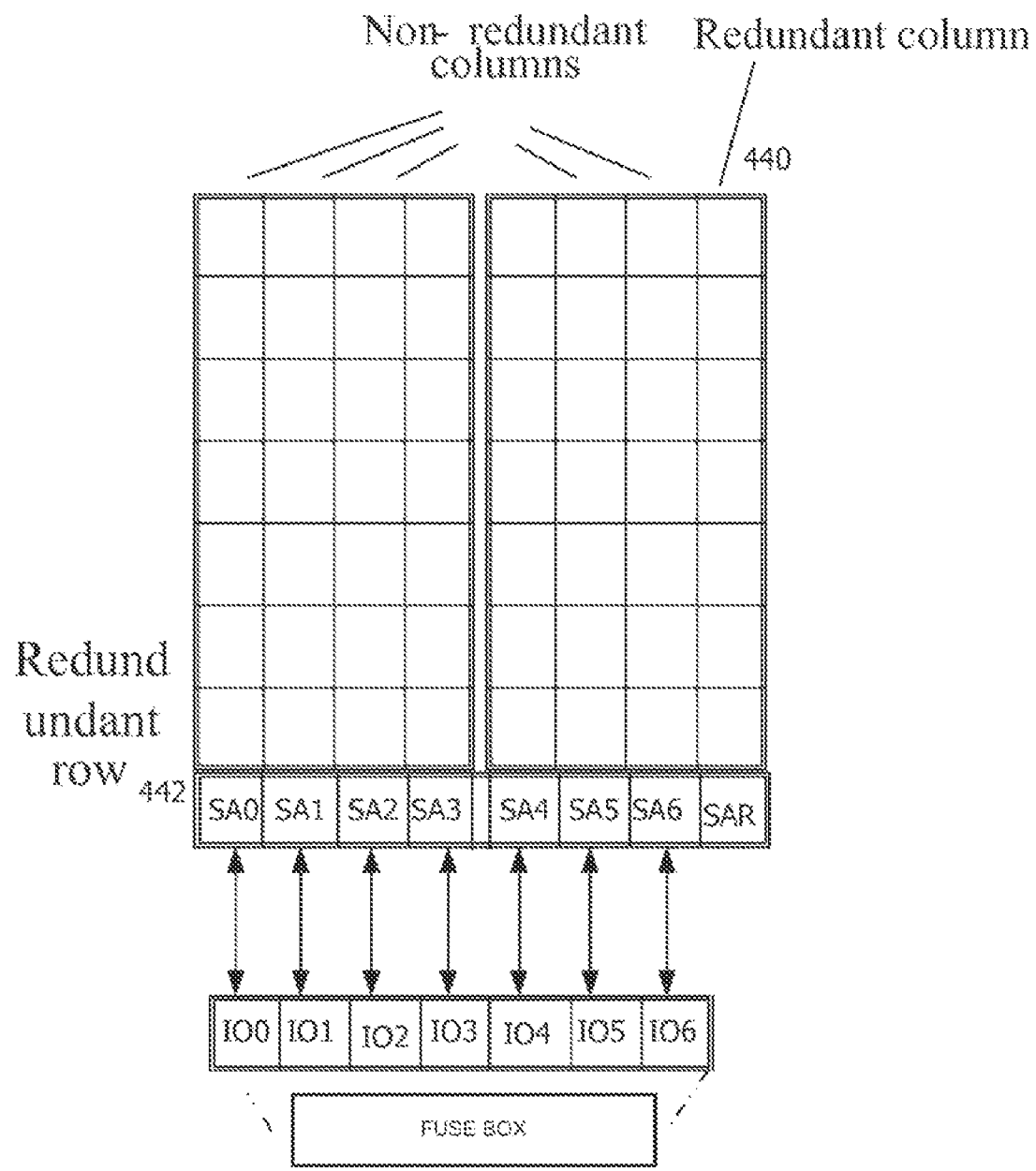
FIG. 4 illustrates an embodiment of a memory instances having built-in redundant components to repair defects found in the memory.

In very large chips having the integrated circuit occupying a large amount of die area on the silicon wafer, if the whole chip is expected to be fault-free, the yield of number of dies per wafer will be very low. However, adding a few spare modules, spare components, and a reconfiguration scheme to the design to make the chip fault-free can increase the yield produced good chips. See FIG. 3 for some additional example logic blocks 336 of an embodiment of a STAR processor added into the design to support repair capability. See FIG. 4 for some additional example redundant components 440, 442 needed to add built-in repair capacity to an embodiment of a memory instance. Naturally, adding these redundant modules and reconfiguration logic will increase the overall chip die area occupied and; thereby, reduce the number of chips that will fit into the fixed dimensions of the fabricated wafer area.

Consequently, the number of produced dies will decrease. Accepting this, yield of fault free produced chips by itself may not be a good measure for produced good dies per wafer.

In contrast, effective yield, defined as $$Y_{\mathit{eff}} = Y \frac{A_{chip\_without\_redundancy}}{A_{chip\_with\_redundancy}},$$

compares the effectiveness of the adding a redundancy solution versus a chip built without any redundant components added. This is a good measure to specific solutions but may be useless if we have no information about 'chip without redundancy' solution and want to compare multiple other solutions like: 1) a fabricated chip with 10% of the memory instances with built-in repair components, 2) a fabricated chip with twenty percent of the memory instances with built-in repair components, etc. To have a common measure for all solutions, we propose to use the number of good dies per wafer defined as $$GDW = Y \frac{A_{wafer}}{A_{chip}},$$

where Y is the yield, $A_{wafer}$ is the wafer area and $A_{chip}$ is the chip area including all the increased area due to all of the built-in repair components.

To make the measure independent from the wafer data, we may use $$GDW = Y \frac{1}{A_{chip}}$$

or some other measure as long as the good dies per wafer takes into account a trade-off between an increase in yield of good integrated circuits with the determined number of memory instances with built-in repair components fabricated on the wafer verses an increase in amount of area the design is expected to occupy when the design has the determined number of memory instances with built-in repair components.

The effective yield optimization in the good dies per wafer takes into account that yield increases due to a memory having spare built-in redundant components and the fact that the accompanied die area increase reduces then the number of dies fitting into the wafer area. Having less chip dies on the wafer will reduce the number of final produced chips. This means that during yield optimization based on memory repair one should focus not on the yield numbers exclusively but on the number of produced good dies. We may use GDW to compare any possible solutions and the solution with the highest GDW number will effectively lower the price for each produced good die on that silicon wafer. For example, if two additional chip dies can be fit onto a single wafer during fabrication and the fabricated wafer now produces 23 chip dies verses 20 produced, and 22 of the 23 are defect repairable then all 22 produced good chip dies will be fabricated at a 10% lower cost (20/22) than merely producing 20 chip dies from that wafer.

Also, an integrated circuit may have a design with various blocks of logic and include one hundred different memory instances configurations populating the design. The different memory instances configurations have different configuration parameters. Thus, each memory instance whether it's a repairable memory or a non-repairable memory will have different parameters such as number of words, number of bits in the memory word, column multiplexer ratio, bank number, number of physical rows/columns, number of redundant rows/columns. See FIG. 4 for examples. These different parameters will also affect the amount of area occupied by the memory instance and the types of defects each memory instance will have when fabricated and reflected as an associated characteristic in the defect distribution model. The memory instances could be used for buffers, registers, caches, and even main memory. Nonetheless, the purpose of each memory instance is not as relevant as the amount of area on the chip die occupied by the memory instance when fabricated and the yield effectiveness that repair capability adds to that memory instance.

Additional definitions and details on embedded a Memory System with test and repair infrastructure can be found in Y. Zorian, "Embedded memory test & repair/Infrastructure IP for SOC yield", ITC 2002 and U.S. Pat. No. 6,519,202.

Referring to FIG. 1, the GOYA tool 100 automates the computation and determination of repairable and non-repairable sets of memory configurations out of an initial set of three or more memory configurations. The base three configurations in the set include making all of the memories repairable, all of the memories non-repairable, and some subset of the memories being repairable as well the remainder of the set of memories being non-repairable.

The GOYA tool 100 can make repairable/non-repairable memory selection based on the example version of the algorithm described below. The algorithm is linear with respect to the number of memory instances used in SoC and selects the subset of memories to be repairable as well the remainder of the set of memories being non-repairable memory instances to achieve the highest possible number of produced good dies for a given defect density and die core area (die core area includes the random logic, and non-repairable and repairable memory areas).

Two main calculations occur in the algorithm. 1) A first calculation by the threshold calculator 102 calculates a threshold-value that-is-expressed-in-area-units for each memory instance and comparing the threshold-value by the comparator 110 to both a maximum and minimum die area values which are representative of the actual area occupied by every memory instance in that design plus the area occupied by the logic components in that design. 2) A second calculation by a good die per wafer calculator 108 calculates an amount of good dies produced per fabricated silicon wafer for each instance of the design starting with all of the memory instances that are projected to be fabricated as repairable via the results of the comparison by the comparator 110 of the threshold-value to the minimum die area value, and recalculated for each design instance all the way up to all of the memory instances that are projected to be fabricated as repairable based on the comparison by the comparator 110 of the threshold-value to the maximum die area value.

Finally, a comparison is made by the comparator 110 of the results of all of the combinations of memory configurations between the maximum die area value and minimum die area value and those combinations' associated number of projected number of good chip dies per wafer stored in a set of storage registers 116, and the comparator 110 selects the highest number of projected good chip dies per fabricated silicon wafer as an optimal design of the integrated circuit design with its subset of the memory instances being chosen to be populated as memory instances having built-in repair components as well as the remaining amount of memory instances to be fabricated without any built-in repair components.

The threshold calculator 102 creates a threshold-value that-is-expressed-in-area-units for each memory instance in the design that accounts for both a change in yield by adding in repair capability to a memory instance and a change in amount of area occupied by adding in repair capability to a memory instance. In an embodiment, the formula for the threshold-value that-is-expressed-in-area-units is calculated by the yield of a memory instance having no repair capability multiplied by an increase change in the amount of area occupied by adding in repair capability to that memory instance divided by the increase change in the yield by adding in the repair capability to the memory instance.

Next, the set of status registers 116 stores the threshold-value that-is-expressed-in-area-units for every memory instance in the integrated circuit's design. Every memory instance in the integrated circuit's design has its threshold-value that-is-expressed-in-area-units ordered relative to the other memory instances in the integrated circuit's design. The threshold-value that-is-expressed-in-area-units are ordered from the memory instance most improved in yield for the amount of increase in occupied area by adding repair capability to that memory instance to the memory instance least improved in yield for the amount of increase in occupied area by adding repair capability to that memory instance. This allows the number of good dies calculation by the good die per wafer calculator 108 to be performed in a linear manner starting with the most improved memory instance progressively down to the least improved instance rather than exponential or some other fashion having to calculate every possible combination of memory instances in the design having repair and not having repair capability built-into that instance and how that relates to the possible number of produced good dies per silicon wafer.

Similarly, as discussed, each memory instance may have different configuration parameters. The threshold-value that is expressed-in-area-units is calculated by the threshold calculator 102 (or pulled from a database of threshold-values 114 if previously calculated) for each memory instance having different configuration parameters. All of these calculated threshold-values expressed in area units for every memory instance are stored in the set of storage registers 116 then ordered from the memory instance most improved in yield for the amount of increase in occupied area by adding repair capability to that memory instance to the memory instance least improved in yield for the amount of increase in occupied area by adding repair capability to that memory instance in order for the algorithm to be linear with respect to the number of memory instances used in the integrated circuit design.

A minimum die area calculator 106 is configured to calculate an initial minimum-limit die-area number expressed in area units which is representative of a projected amount of area to be occupied by every memory instance in that integrated circuit design on the die plus an area occupied by all of the logic components in that design and the initial minimum-limit die-area number is representative of the projected area to be occupied by every memory instance in the integrated circuit being populated without any built-in redundant components.

The minimum die area calculator 106 performs the minimum-limit die-area number calculation iteratively every time memory instances are determined to be fabricated with built-in repair components, and the comparator 110 compares a new minimum-limit die-area, with the added area due to the inclusion of the built-in repair components, to the threshold-values of the memory instances of the integrated circuit design until a break point occurs where no additional memory instances have a threshold-value-expressed-in area-units less than or equal the new minimum-limit die-area number representative of the area occupied by the accumulated memory instances in the design, with some subset of the memories instances now determined to be populated with built-in repair capability.

In this example from FIG. 2, the accumulated area in the design occupied by logic, processors, DSPs, arbiters, etc., is projected to be 5 MM squared and the one hundred memory instances in memory system 1 (MS1) thru memory system 3 (MS3) are projected to total 20 mm square. The initial minimum-limit die-area number representative of the area occupied by the accumulated memory instances in the design is 5 mm (for the logic)+20 MM (for the non-repairable memory instances)=25 MM. Any memory instance with a threshold-value expressed-in-area-units less than or equal to 25 MM would be assigned to be populated as a memory instance with repair capability. For example, 18 out of the 100 memory instances may have a threshold-value expressed-in-area-units less than or equal to 25 MM and are assigned to be populated as a memory instance with repair capability. Next, the increase in the numbers of memories with repair capability increases the minimum-limit die-area number expressed in area units representative of the area to be occupied by the accumulated memory instances in the design on the chip die. The new minimum-limit die-area number when the 18 repairable memories and 82 non-repairable memories is for example 27 MM. (5 MM of logic plus summing the area occupied by the non-repairable memory instances plus the repairable memory instances adds up to 22 MM). Any memory instance with a threshold-value expressed-in-area-units less than or equal to 27 MM would be assigned to be populated as a memory instance with repair capability. This iterative process occurs until a break point occurs and no additional memory instances have a threshold-value expressed-in-area-units less than or equal the new minimum limit die area number expressed in area units representative of the area occupied by the accumulated memory instances in the design on a chip die. Let us say 30 total memory instances out of the one hundred in the design have a threshold-value expressed-in-area-units less than or equal the final minimum limit die area number representative of the area occupied by the accumulated memory instances in the design. These 30 memory instances are projected to be populated as repairable memories and will be the starting number used in the amount of good dies produced per fabricated silicon wafer calculation.

Next, the algorithm calculates the maximum-limit die-area number. A maximum die area calculator 104 calculates an initial maximum-limit die-area number that is representative of the area occupied by the logic and accumulated memory instances considering all of the memories have been populated with repair capability. Let us say it will result 35 MM. Any memory instance with a threshold-value expressed-in-area-units more than or equal to the initial maximum limit die area of 35 MM would be assigned to be populated as a memory instance without repair capability. For example, 10 out of the 100 memory instances may have threshold-value expressed-in-area-units more than or equal to 35 MM and are assigned to be populated as a memory instance without repair capability. Excluding the repair capability for those 10 instances will reduce the die area with some delta value. Let us say the new maximum-limit die-area number is now is 33 MM. Any memory instance with a threshold-value expressed-in-area-units more than or equal to the maximum limit die area of 33 MM would be assigned to be populated as a memory instance without repair capability. This iterative process occurs until a break point occurs and no additional memory instances have a threshold-value expressed-in-area-units more than or equal the new maximum limit die area number expressed in area units representative of the area occupied by the accumulated memory instances in the design on the chip die. Let us say 20 total memory instances out of the 100 in the design have threshold-value expressed-in-area-units more than or equal the final maximum-limit die-area number expressed in area units representative of the area occupied by the accumulated memory instances in the design on the chip die. These 20 memory instances are projected to be populated as non-repairable memories.

Next, the algorithm calculates the amount of good dies produced per fabricated silicon. A good die per wafer calculator 108 calculates an amount of good dies produced per fabricated silicon wafer initially based on starting with just the increased area of the memory instances projected to be repairable by a having a threshold-value that-is-expressed-in-area-units equal to or lower than the final minimum-limit die-area calculation and comparison. The good die per wafer calculator 108 calculates the amount of good dies produced per fabricated silicon wafer iteratively based on adding into the calculation the increased area and yield of the remaining memory instances when built-in repair components are added to another memory instance, in a one by one linear manner, in the design all the way to a maximum number of memory instances having repair capability built-in determined by the results of the final maximum die area calculation and comparison.

In the current example, the amount of good dies produced per fabricated silicon wafer calculation is initially calculated by the good die per wafer calculator 108 for the memory configuration of 30 memories being populated as repairable. The resulting number of good chip dies is stored in the set of storage registers 116 and associated with the memory configuration of 30 memories being repairable. For example, a fixed wafer of 12 inches×12 inches with an integrated circuits having 30 of the 100 memory instances with built-in repair capability may produce twenty one good chip dies on that single wafer. The amount of good dies produced per fabricated silicon wafer calculation is iteratively calculated for each numerical increment above 30 in a one by one a linear fashion up to all a memory configuration with eighty (80=100–20) memories being populated as repairable. Note, the maximum die area calculation determined at least 20 memory instances should not be populated with repair components due to their threshold-values.

Each time the good die per wafer calculator 108 performs this calculation, the resulting number of good chip dies produced is stored and associated with that particular number of memory instances being made repairable. After all of the amount of good dies produced per fabricated silicon wafer calculation occur, then finally the integrated circuit design having the memory configuration with a highest amount of good dies produced per fabricated silicon wafer is selected. For example, it may be found that for the fixed wafer of 12 inches×12 inches with the integrated circuit having a memory configuration of having fifty four of the one hundred memory instances populated with built-in repair capability may produce twenty two good chip dies on that single wafer.

As an improvement variant of the algorithm, memory instances in the design having the same configuration are grouped together so merely one threshold-value expressed-in-area-units is calculated for that group of memory instances. During the iteration calculations of considering certain amount of memory instances with repair capability (..., 35 repairable memory instances, 36 repairable memory instances, 37 repairable memory instances, ...) the algorithm may skip considering some of the iterations, if different memory instances have the same threshold-value expressed-in-area-units (particularly, if they have the same configuration). For example if $A_t^{35}=A_t^{36}=A_t^{37}=A_t^{38}$ then the algorithm may iterate only over the specified subsets of repairable memory instances: 34 repairable memory instances, 38 repairable memory instances, 39 repairable memory instances, etc. As you may see, this allows the algorithm to skip four iterations.

FIG. 5 illustrates an example table having comparison data for a System on a Chip design with one hundred and nineteen memory instances. The number of good dies per wafer produced by embedding the System on a Chip design with one hundred and nineteen memory instances is depicted for different defect densities and different amounts of memories being populated with built-in repair capability. The algorithm is compared with simple solutions (all repairable and all non-repairable) as well as more advanced (currently industry standard) repairable/non-repairable selection algorithm that uses non-repairable memories for the small bit-count memories up to an aggregate 2 M-bit, and then uses repairable memories for all remaining memories beyond the 2 M-bits. The right hand column shows the results from the electronic design tool determining the right balance of memory instances to be fabricated with built-in repair components and the remaining amount of memory instances to be fabricated without any built-in repair components in the integrated circuit design to achieve the highest number of good chip dies per silicon wafer for a given defect density. For example, for a defect density of 0.42 $CM^2$, two hundred and sixty nine good dies are produced if all of the memory instances are populated as repairable, two hundred and sixty eight good dies are produced if all of the memory instances are populated without any repair capability, and two hundred and ninety four good dies are produced if the electronic design tool determines the right balance of memory instances to be fabricated with built-in repair components to the remaining amount of memory instances to be fabricated without any built-in repair components.

Yield and the number of good dies per wafer (GDW) numbers are calculated for a 12 inch$^2$ wafer. The GOYA tool also calculated the corresponding numbers for all repairable or all non-repairable solutions. As shown in the Table 550 for some defect density values, the memory configuration with all repairable memories provides a higher yield number than the recommended configuration; however, the additional area assigned for reparability, significantly reduces the number of chip dies fitting on the wafer. The Table 550 shows that the recommended SoC configurations from the GOYA tool provides an additional 10% more good dies than any of the simple solutions. An increase of the number of good dies by 10% means a reduction of the chip price by 10%.

The tool and algorithm may have additional example variations.

Referring to FIG. 1, in an embodiment, the algorithm of linear complexity could alternatively be logarithmic but the solution set in the calculation becomes realistically to big after the first forty orders of magnitude. The algorithm of linear complexity with respect to the number of memory instances located on the SoC is introduced to allow optimal reparability assignment for embedded SRAMs to achieve the highest possible yield. The electronic design GOYA tool 100 may be configured for yield enhancement of embedded SRAMs and other Memory Systems (MS). The electronic design GOYA tool 100 allows identification of the subset of memory instances that must be repairable to achieve the biggest number of good chip dies per wafer (GDW). The electronic design GOYA tool 100 works for all defect distribution models that allow independent yield estimation for different memory cores (Poisson distribution, negative binomial distribution with small area clustering, etc.).

The algorithm employed by the electronic design GOYA tool 100 has multiple variants and at least three will be described. The algorithm can make an initial calculation and recalculated for every memory instance in the design. The algorithm can condense the calculation by grouping similar memory in size and construction on the same chip into a single calculation. The algorithm can elimination many iterations by comparing a threshold-value to reasonable approximations of minimum and maximum die area that result in a minimum and maximum number of memory instances that are populated with built-in repair capacity.

The efficient algorithm of linear complexity with respect to the number of memory instances embedded on the SoC maximizes the number of produced good dies for SoCs with memories and memory systems. The algorithm identifies the memory instances that should be fabricated with repair components and the memory instances that should be non-repairable based upon taking into account a trade-off between an increase in yield of good integrated circuits with the determined number of memory instances with built-in repair components fabricated on the wafer verses an increase in amount of area the design is expected to occupy when the design has the determined number of memory instances with built-in repair components. The algorithm can be used for any analytical defect distribution model that considers the yield of different SoC cores independent The GOYA tool 100 uses an algorithm that allows considering memory configurations in a predefined order based on their threshold area values versus the previous approaches where people use a bit-count based ordering or size based ordering. The ordering allows finding the optimal breakdown of memory configurations into repairable/non-repairable subsets instead of approximations of it that other algorithms find.

The algorithm may also apply several optimizations (see steps C3 and C5 of the algorithm below) that allows reducing the algorithm run-time by 2-3 times. The final variant of the algorithm uses a measure (so called threshold-value that-is-expressed-in-area-units) that allows considering memory instances, repairable and non-repairable, with yields in a predefined order without using the generality of the solution. The efficient algorithm finds the best configuration of reparable and non-reparable memories to achieve the highest possible effective yield (number of good dies per wafer). The tool allows users to plan a chip design with highest possible yield in the design stage of the generation of a System on a Chip.

The GOYA tool 100 configured for yield prediction and evaluation for SRAM and Memory System (MS) compilers allows the user design of a memory system in a SoC with hundreds of memory cores with the highest number of produced good dies among all possible memory configurations that the compiler allows within the range of its parameters. The GOYA tool 100 is configured to also calculate the optimal amount of redundant memory instances to be used with an integrated circuit design. Specifically, for different models of defect probability distribution (e.g., Poisson distribution, negative binomial distribution, etc) the user has the possibility to:

Define the types (memories with or without redundant elements) and sizes of all memory cores, and the tool will calculate the overall SoC yield, as well as the effective yield;

Define the overall memory size and the number of memory cores on the SoC, and the tool will suggest the best configuration for each memory core with the highest possible overall SoC yield of good chip dies;

Generate diagrams and graphics via the user interface 120 on how the number of words, banks, column multiplexers, redundant elements, etc, affect the yield of a memory core and the SoC.

The GOYA tool 100 works for all defect distribution models that allow independent yield estimation for different memory cores and has linear complexity with respect to the number of memory instances embedded in SoC. The GOYA tool 100 requires merely several seconds of calculation the optimal configuration/ratio of non-repairable (ASAP) and repairable STAR memory cores to be put on a chip to give the highest possible number of good chip dies per silicon wafer fabricated.

The GOYA tool 100 automates the computation and determination of repairable and non-repairable sets of memory configurations out of an initial set of three or more memory configurations including all memories repairable, all memories being non-repairable, and some subset of memories being repairable as well the remainder of the set of memories being non-repairable. The automated tool takes a list of memory configurations as an input and as an output lists of memory configurations, with subsets of repairable memories and non-repairable memories.

Another main advantage of the GOYA tool 100 is that the GOYA tool 100 allows the designer in the preliminary phases of design when the floor planning is not finished yet, to predict the optimal possible number of good dies per wafer. The GOYA tool 100 estimates and improves the yield before floor planning of the SoC. During the SoC design phase, it is very important to choose correct repairable or non-repairable memory instances with specified configurations (number of words, number of bits per word, etc.) to achieve the highest possible number of produced good dies.

The amount of fabricated Good chip Dies per silicon Wafer (GDW) numbers should be estimated for all possible repairable subsets of memory instances and the configuration with the highest GDW number should be selected. The good chip dies would pass the quality control checks for defective memories or defects present after fabrication are repairable by the redundant components. The GOYA tool 100 calculates a maximum number of produced good dies based on an optimal solution of yield/area trade off.

The GOYA tool 100 can reference a memory structural model to allow automatic estimation of the memory instance area and the repair scheme that are required for Yield/Good dies per wafer estimation.

EXAMPLE

Algorithms

The GOYA tool 100 can make the decision locally at each memory with the base algorithm or with the more efficient versions of the algorithms make a global decision, i.e. finalizing the selection of non-repairable (ASAP) memory instances and repairable (STAR) memory instances after analyzing the information from all the memories.

During the calculation of MS yield, the additional die area for the repair capability components should be taken into account for model accuracy.

As discussed previously, $$GDW = Y \frac{A_{wafer}}{A_{chip}},$$

where Y is the yield, $A_{wafer}$ is the wafer area and $A_{chip}$ is the chip area including all the spares.

Assume a non-repairable memory instance with yield $Y_m$ and area $A_m$. Also, let us assume that adding redundancy to it will increase the yield with $\Delta Y_m$, and the area with $\Delta A_m$. If we want to embed this memory instance into our design and want to analyze the trade-off between repairable and non-repairable solution, we need to compare the following numbers:

$$Y^* Y_m * \frac{A_w}{A}$$

and $$Y^*(Y_m + \Delta Y_m)^* \frac{A_w}{A + \Delta A_m},$$

where $A_w$ is the wafer area, A is the SoC area (including the area of the non-repairable memory) and Y is the SoC yield (not including memory cores). We can easily notice that it is worthwhile to use repairable memory if $$A > Y_m \frac{\Delta A_m}{\Delta Y_m}.$$

Let us denote $$Y_m \frac{\Delta A_m}{\Delta Y_m}$$

with $A_t$ and call it "the transition area for the instance" and an example of a possible measure used as a threshold-value.

The first variant of the algorithm is a follows. The following simple algorithm (A) finds the optimal subset of repairable memories out of the given set of memory configurations.

A1: Calculate $A_t^k$ values for all $1 \leq k \leq N$ and arrange them by increasing order.
A2: Estimate the GDW numbers for the following subsets of repairable memories:
1. All non-repairable memories,
2. First instance is repairable, the rest are non-repairable,
3. First 2 instances are repairable, the rest are non-repairable,
... and continue until
N: First (N−1) instances are repairable and the last one is non-repairable,
N+1: All repairable instances.
A3: Select the configuration with the highest GDW number.

This algorithm requires N+1 GDW estimations and is easy to implement in software. Note, if there are multiple memory instances with identical transition areas, it is not necessary to consider them separately during sub-steps of step A2 of algorithm A. In practice, SoC designs use multiple memory instances with identical memory configuration and it can significantly improve the performance of the algorithm if we consider groups of memory instances of the same size, instead of individual instances per each sub-step.

The second variant of the algorithm is a follows. Algorithm B demonstrates the enhancement of the first variant algorithm A.

Calculate $A_t^k$ values for all $1 \leq k \leq N$ and arrange them by increasing order.
Group memory instances with equal $A_t^k$ numbers (assume it results to $N^1$ groups).
Estimate the GDW numbers for the following subsets of repairable memories:
All non-repairable memories,
First group of memory instances are repairable, the rest are non-repairable,
First 2 groups of memory instances are repairable, the rest are non-repairable,
... and continue until
$N^1$: First ($N^1-1$) groups of memory instances are repairable the rest are non-repairable,
$N^1+1$: All repairable instances.
Select the configuration with the highest GDW number.

Also, every memory instance in the integrated circuits design should have its threshold-value that-is-expressed-in-area-units ordered relative to the other memory instances.

Consider a chip with the following memory instances and 2.5 mm^2 random logic on it.

| # | NW | NB | count |
|---|------|-----|-------|
| 1 | 1024 | 16 | 2 |
| 2 | 2048 | 8 | 3 |
| 3 | 8096 | 16 | 1 |
| 4 | 512 | 64 | 5 |
| 5 | 16384 | 128 | 3 |

First, the GOYA tool 100 calculates the threshold-area-values for each memory configuration and orders memories in increasing order. For the above case, the order will be 5, 3, 1, 2, and 4.

1. The tool considers all of the memory instances in the design to be populated as non-repairable and estimates the chip yield (good dies per wafer). Let us denote it with Y0.
2. The tool considers first configuration (5) of the memory instances in the design to be populated with built-in repair capability (even if there is more than one instances of 5th configuration), while the remaining instances stay non-repairable. Let us denote the estimated yield as Y1.
3. The tool considers the first two configurations (5, 3) of memories to be populated with built-in repair capability, while the remaining memory instances stay non-repairable. Let us denote the estimated yield as Y2.

This process continues in an iterative process to estimate Y3, Y4 and Y5. The algorithm proves that the maximum Y value corresponds to the optimal point.

The algorithm proves two key lemmas.

1. The optimal SoC configuration may not contain different types (STAR/ASAP) of the same memory configuration.
2. If the optimal SoC configuration assigns repairability (makes STAR) to an instance with At threshold area, then it will assign repairability to all instances with lower threshold areas.

The second lemma allows ordering of memory instances, and considering them sequentially, while the first one allows minimizing the steps of the algorithm.

If the optimal subset of repairable memories out of N instances contains the memory index with index k then it also contains all memory instances with indexes less than k.

Proof: Let us assume that there exists a memory instance with index k'<k that is not included in the optimal subset of repairable instances.

As the selected subset of reparable memories is the optimal one, hence it will reduce the number of good dies per wafer if we change the k-th instance from repairable to non-repairable. This conclusion means that the SoC area is larger than $A_t^k$. Based on the assumption above, it is also larger than $A_t^{k'}$. Having this, we may show that the number of good dies per wafer will increase if we change the k'-th instance from non-repairable to repairable, but this contradicts the assumption that we had the optimal subset of repairable memories.

As discussed earlier, to model the yield of a given chip, some analytical probability model is necessary to describe the expected spatial distribution of manufacturing defects and, consequently, of the resulting faults that cause yield loss. The most common yield model is the Poisson model. Although other models exist, the Poisson distribution is widely used in yield estimations due to the ease of calculation.

Let λ denote the average number of faults on the chip. The probability of having k defects on the chip in Poisson defect distribution will be equal $$Pr(X = k) = e^{-\lambda} \frac{\lambda^k}{k!}.$$

In case of chip with no defect tolerance the yield (denoted by Y) will be equal $$Y=Pr(X=0)=e^{-\lambda}.$$

The Poisson distribution allows an easy yield calculation, but it does not correctly model the realistic defect distribution. The manufacturing defects have more clusters than predicted by the Poisson distribution. Several analytical distribution models have been suggested, more notably negative binomial distribution. Negative binomial distribution has two parameters λ (average number of defects) and a (clustering parameter). The probability of having k defects on the chip in negative binomial defect distribution will be equal $$Pr(X = k) = \frac{\Gamma(\alpha + k)}{k!\Gamma(\alpha)} \cdot \frac{(\lambda/\alpha)^k}{(1 + \lambda/\alpha)^{\alpha+k}}.$$

In case of a chip with no defect tolerance, the yield will be equal $$Y=(1+\lambda/\alpha)^{-\alpha}$$

A negative binomial distribution model fits well with actual fault distribution. However, estimating yield for such a fault distribution model (large or medium area clustering), the chip floor plan is generally required. The tool implements yield models that estimate the yield independently for each core of the SoC.

In case of repairable memories and memory systems, the yield calculation is slightly different. The memory core that can tolerate up to n faults will have yield equal to $$Y = \sum_{k=0}^{n} Pr(X = k).$$

Figure 6:
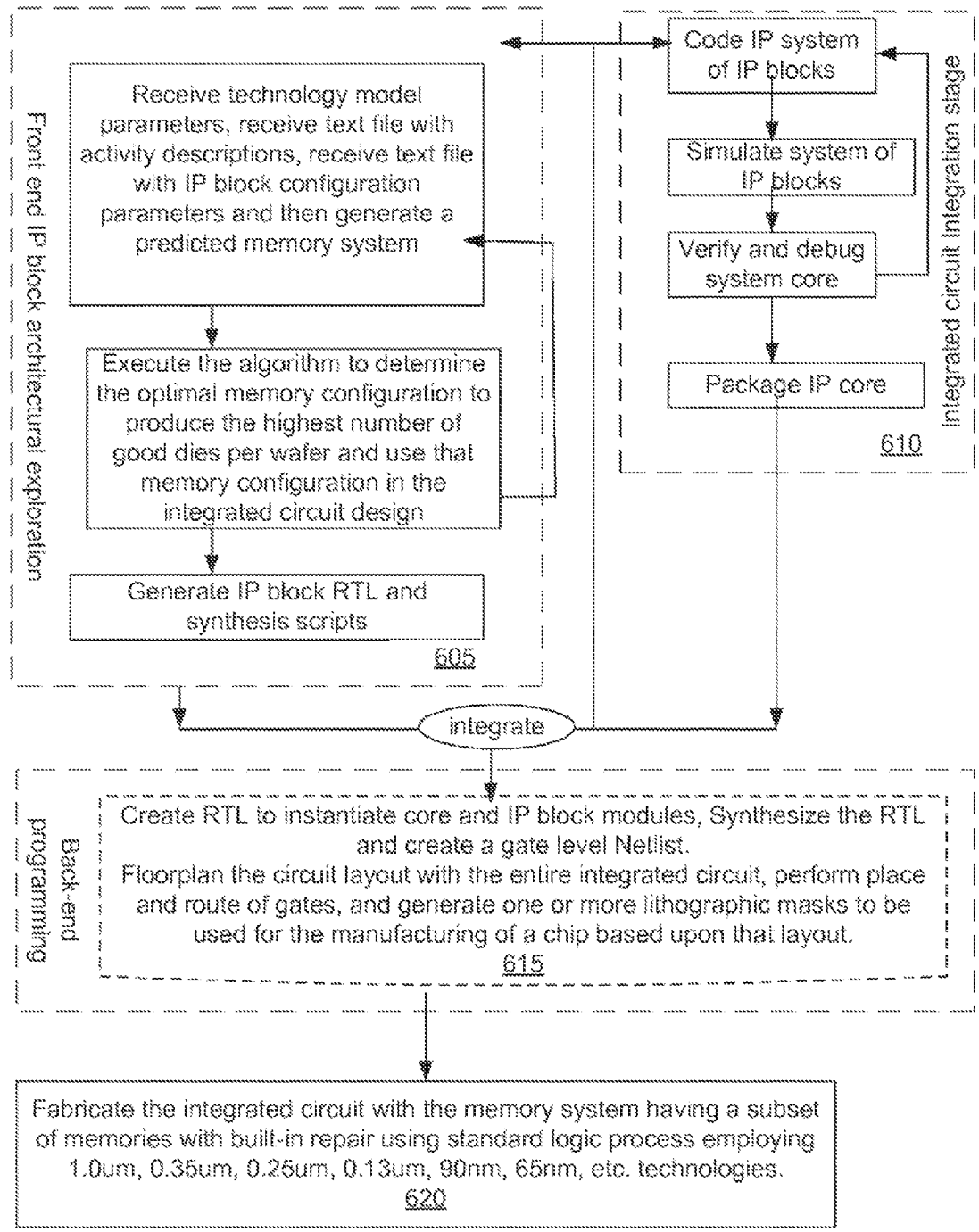
FIG. 6 illustrates a flow diagram of an embodiment of an example of a process for generating a device, such as a System on a Chip, with the designs and concepts discussed above for the Memory system.

FIG. 6 illustrates a flow diagram of an embodiment of an example of a process for generating a device, such as a System on a Chip, with the designs and concepts discussed above for the Memory system. The example process for generating a device with from designs of the Memory system may utilize an electronic circuit design generator, such as a Memory compiler or a System on a Chip compiler, to form part of an Electronic Design Automation (EDA) toolset. Hardware logic, coded software, and a combination of both may be used to implement the following design process steps using an embodiment of the EDA toolset. The EDA toolset such may be a single tool or a compilation of two or more discrete tools. The information representing the apparatuses and/or methods for the circuitry in the memory system, etc may be contained in an Instance such as in a cell library, soft instructions in an electronic circuit design generator, or similar machine-readable storage medium storing this information. The information representing the apparatuses and/or methods stored on the machine-readable storage medium may be used in the process of creating the apparatuses, or representations of the apparatuses such as simulations and lithographic masks, and/or methods described herein.

Aspects of the above design may be part of a software library containing a set of designs for components making up the Memory system and associated parts. The library cells are developed in accordance with industry standards. The library of files containing design elements may be a stand-alone program by itself as well as part of the EDA toolset.

In an embodiment, an example EDA toolset may comprise the following: a graphic user interface; a common set of processing elements; and a library of files containing design elements such as circuits, control logic, and cell arrays that define the EDA tool set. The EDA toolset may be one or more software programs comprised of multiple algorithms and designs for the purpose of generating a circuit design, testing the design, and/or placing the layout of the design in a space available on a target chip. The EDA toolset may include object code in a set of executable software programs. The set of application-specific algorithms and interfaces of the EDA toolset may be used by system integrated circuit (IC) integrators to rapidly create an individual IP core or an entire System of IP cores for a specific application. The EDA toolset provides timing diagrams, power and area aspects of each component and simulates with models coded to represent the components in order to run actual operation and configuration simulations. The EDA toolset may generate a Netlist and a layout targeted to fit in the space available on a target chip. The EDA toolset may also store the data representing the memory system and logic circuitry on a machine-readable storage medium.

Generally, the EDA toolset is used in two major stages of SOC design: front-end processing and back-end programming.

Front-end processing includes the design and architecture stages, which includes design of the SOC schematic. The front-end processing may include connecting models, configuration of the design, simulating, testing, and tuning of the design during the architectural exploration. The design is typically simulated and tested. Front-end processing traditionally includes simulation of the circuits within the SOC and verification that they should work correctly. The tested and verified components then may be stored as part of a stand-alone library or part of the IP blocks on a chip. The front-end views support documentation, simulation, debugging, and testing.

In block 605, the EDA tool set may receive a user-supplied text file having data describing configuration parameters and a design for the memory system. The data may include one or more configuration parameters for that Intellectual Property block. The IP block description may be an overall functionality of that IP block such as an Memory system. The configuration parameters for the Memory system IP block may be number of address regions in the system, system addresses, how data will be routed based on system addresses, etc.

The EDA tool set receives user-supplied implementation technology parameters such as the manufacturing process to implement component level fabrication of that IP block, an estimation of the size occupied by a cell in that technology, an operating voltage of the component level logic implemented in that technology, an average gate delay for standard cells in that technology, etc. The technology parameters describe an abstraction of the intended implementation technology. The user-supplied technology parameters may be a textual description or merely a value submitted in response to a known range of possibilities.

The EDA tool set may partition the IP block design by creating an abstract executable representation for each IP sub component making up the IP block design. The abstract executable representation models TAP characteristics for each IP sub component and mimics characteristics similar to those of the actual IP block design. A model may focus on one or more behavioral characteristics of that IP block. The EDA tool set executes models of parts or all of the IP block design. The EDA tool set summarizes and reports the results of the modeled behavioral characteristics of that IP block. The EDA tool set also may analyze an application's performance and allows the user to supply a new configuration of the IP block design or a functional description with new technology parameters. After the user is satisfied with the performance results of one of the iterations of the supplied configuration of the IP design parameters and the technology parameters run, the user may settle on the eventual IP core design with its associated technology parameters.

The EDA tool set integrates the results from the abstract executable representations with potentially additional information to generate the synthesis scripts for the IP block. The EDA tool set may supply the synthesis scripts to establish various performance and area goals for the IP block after the result of the overall performance and area estimates are presented to the user.

The EDA tool set may also generate an RTL file of that IP block design for logic synthesis based on the user supplied configuration parameters and implementation technology parameters. As discussed, the RTL file may be a high-level hardware description describing electronic circuits with a collection of registers, Boolean equations, control logic such as "if-then-else" statements, and complex event sequences.

In block 610, a separate design path in an ASIC or SOC chip design is called the integration stage. The integration of the system of IP blocks may occur in parallel with the generation of the RTL file of the IP block and synthesis scripts for that IP block.

The EDA toolset may provide designs of circuits and logic gates to simulate and verify the operation of the design works correctly. The system designer codes the system of IP blocks to work together. The EDA tool set generates simulations of representations of the circuits described above that can be functionally tested, timing tested, debugged and validated. The EDA tool set simulates the system of IP block's behavior. The system designer verifies and debugs the system of IP blocks' behavior. The EDA tool set tool packages the IP core. A machine-readable storage medium may also store instructions for a test generation program to generate instructions for the memory instances described herein. One of ordinary skill in the art of electronic design automation knows that a design engineer creates and uses different representations, such as model simulations, etc. to help generating tangible useful information and/or results. Many of these representations can be high-level (abstracted and with less details) or top-down views and can be used to help optimize an electronic design starting from the system level. In addition, a design process usually can be divided into phases and at the end of each phase, a tailor-made representation to the phase is usually generated as output and used as input by the next phase. Skilled engineers can make use of these representations and apply heuristic algorithms to improve the quality of the final results coming out of the final phase. These representations allow the electric design automation world to design circuits, test and verify circuits, derive lithographic mask from Netlists of circuit and other similar useful results.

In block 615, next, system integration may occur in the integrated circuit design process. Back-end programming generally includes programming of the physical layout of the SOC such as placing and routing, or floor planning, of the circuit elements on the chip layout, as well as the routing of all metal lines between components. The back-end files, such as a layout, physical Library Exchange Format (LEF), etc. are generated for layout and fabrication.

The generated device layout may be integrated with the rest of the layout for the chip. A logic synthesis tool receives synthesis scripts for the IP core and the RTL design file of the IP cores. The logic synthesis tool also receives characteristics of logic gates used in the design from a cell library. RTL code may be generated to instantiate the SOC containing the system of IP blocks. The system of IP blocks with the fixed RTL and synthesis scripts may be simulated and verified. Synthesizing of the design with Register Transfer Level (RTL) may occur. The logic synthesis tool synthesizes the RTL design to create a gate level Netlist circuit design (i.e. a description of the individual transistors and logic gates making up all of the IP sub component blocks). The design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist can also describe the connectivity of an electronic design such as the components included in the design, the attributes of each component and the interconnectivity amongst the components. The EDA tool set facilitates floor planning of components including adding of constraints for component placement in the space available on the chip such as XY coordinates on the chip, and routes metal connections for those components. The EDA tool set provides the information for lithographic masks to be generated from this representation of the IP core to transfer the circuit design onto a chip during manufacture, or other similar useful derivations of the circuits described above. Accordingly, back-end programming may further include the physical verification of the layout to verify that it is physically manufacturable and the resulting SOC will not have any function-preventing physical defects.

In block 620, a fabrication facility may fabricate one or more chips with the integrated circuit having an optimal memory configuration utilizing the lithographic masks generated from the EDA tool set's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light including X-rays and extreme ultraviolet radiation may pass through these lithographic masks onto the chip to transfer the circuit design and layout for the test circuit onto the chip itself.

The EDA toolset may have configuration dialog plug-ins for the graphical user interface. The EDA toolset may have an RTL generator plug-in for the compiler. The EDA toolset may have a SystemC generator plug-in for the compiler. The EDA toolset may perform unit-level verification on components that can be included in RTL simulation. The EDA toolset may have a test validation testbench generator. The EDA toolset may have a dis-assembler for virtual and hardware debug port trace files. The EDA toolset may be compliant with open core protocol standards. The EDA toolset may have Transactor models, Bundle protocol checkers, monitors to display memory activity, analyze performance of a bundle, as well as other similar programs.

As discussed, an EDA tool set may be implemented in software, logic, or a combination of both as a set of data and instructions, such as an Instance in a software library callable to other programs or an EDA tool set consisting of an executable program with the software cell library in one program, stored on a machine-readable medium.

A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; EPROMs; EEPROMs; FLASH, magnetic or optical cards; or any other type of media suitable for storing electronic instructions. The instructions and operations also may be practiced in distributed computing environments where the machine-readable media is stored on and/or executed by more than one computer system. The software code may be written in any number of software programming languages such as hardware description language, C, C+, etc.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A method for designing an integrated circuit for fabrication on a wafer, comprising:
   at a computing device, computing, for each memory component in the integrated circuit, a parameter based on an increase in a size of the of each memory component by adding redundant component for repairing one or more defects in each memory component and an increase in yield of good integrated circuit by adding the redundant component to each memory component, the good integrated circuits comprising flawless integrated circuits and integrated circuits rendered operational by repairing the one or more defects using the added redundant component;
   computing numbers of good integrated circuits expected from the wafer for different configurations of the integrated circuits based on the parameter, each configuration having different combinations of memory components associated with redundant components for repairing the one or more defects; and
   selecting a configuration of the integrated circuit based on the number of good integrated circuits expected from the wafer.

2. The method of claim 1, wherein computing the number of good integrated circuits comprising repeating computation of the number of good integrated circuit for each configuration of the integrated circuits.

3. The method of claim 2, wherein a number of memory components associated with the redundant components is increased linearly for each iteration.

4. The method of claim 1, wherein the parameter corresponds to yield of a memory component having no redundant component multiplied by the increase in the size of each memory component by adding the redundant component divided by increase in the yield by adding the redundant component to each memory component.

5. The method of claim 4, further comprising:
   (a) ordering memory components in the integrated circuit based on parameters of the memory components;
   (b) computing a number of good integrated circuits obtained by providing a redundant component to a first memory component indicated as resulting in largest increase in yield by a parameter associated with the first memory component;
   (c) computing a number of good integrated circuits obtained by providing a redundant component to a n-th memory component indicated as resulting in n-th largest increase in yield by a parameter associated with the n-th memory component, wherein n is an integer not less than 2; and
   (d) increasing n and repeating (c) until a condition is satisfied.

6. A system for designing an integrated circuit for fabrication on a wafer, comprising:
   a threshold calculator configured to compute, for each memory component in the integrated circuit, a parameter a parameter based on an increase in a size of the of each memory component by adding redundant component for repairing one or more defects in each memory component and an increase in yield of good integrated circuit by adding the redundant component to each memory component, the good integrated circuits comprising flawless integrated circuits and integrated circuits rendered operational by repairing the one or more defects using the added redundant component;

a good die calculator configured to compute numbers of good integrated circuits expected from the wafer for different configurations of the integrated circuits based on the parameter, each configuration having different combinations of memory components associated with redundant components for repairing the one or more defects; and a comparator configured to select a configuration of the integrated circuit based on the number of good integrated circuits expected from the wafer.

7. The system of claim 6, wherein the good die calculator is configured repeat computation of a number of good integrated circuit for each configuration of the integrated circuits.

8. The system of claim 7, wherein a number of memory components associated with the redundant components is increased linearly for each iteration.

9. The system of claim 6, wherein the parameter corresponds to yield of a memory component having no redundant component multiplied by the increase in the size of each memory component by adding the redundant component divided by increase in the yield by adding the redundant component to each memory component.

10. The system of claim 9, wherein the comparator is further configured to order memory components in the integrated circuit based on parameters of the memory components, and wherein the good die calculator is configured to:

(a) compute a number of good integrated circuits obtained by providing a redundant component to a first memory component indicated as resulting in largest increase in yield by a parameter associated with the first memory component;

(b) computing a number of good integrated circuits obtained by providing a redundant component to a n-th memory component indicated as resulting in n-th largest increase in yield by a parameter associated with the n-th memory component, wherein n is an integer not less than 2; and (c) increasing n and repeating (b) until a condition is satisfied.

11. A non-transitory computer-readable storage medium structured to store instructions executable by a processor in a firs computing device, the instructions, when executed cause the processor to:

compute, for each memory component in the integrated circuit, a parameter based on an increase in a size of each memory component by adding redundant component for repairing one or more defects in each memory component and an increase in yield of good integrated circuit by adding the redundant component to each memory component, the good integrated circuits comprising flawless integrated circuits and integrated circuits rendered operational by repairing the one or more defects using the added redundant component;

compute numbers of good integrated circuits expected from the wafer for different configurations of the integrated circuits based on the parameter, each configuration having different combinations of memory components associated with redundant components for repairing the one or more defects; and select a configuration of the integrated circuit based on the number of good integrated circuits expected from the wafer.

12. The medium of claim 11, wherein instructions to compute the number of good integrated circuits comprising instructions to repeat computation of the number of good integrated circuit for each configuration of the integrated circuits.

13. The medium of claim 12, wherein a number of memory components associated with the redundant components is increased linearly for each iteration.

14. The medium of claim 11, wherein the parameter corresponds to yield of a memory component having no redundant component multiplied by the increase in the size of each memory component by adding the redundant component divided by increase in the yield by adding the redundant component to each memory component.

15. The medium of claim 14, further comprising instructions to:

(a) order memory components in the integrated circuit based on parameters of the memory components;

(b) compute a number of good integrated circuits obtained by providing a redundant component to a first memory component indicated as resulting in largest increase in yield by a parameter associated with the first memory component;

(c) compute a number of good integrated circuits obtained by providing a redundant component to a n-th memory component indicated as resulting in n-th largest increase in yield by a parameter associated with the n-th memory component, wherein n is an integer not less than 2; and (d) increase n and repeat (c) until a condition is satisfied.

* * * * *